United States Patent [19]
Lee

[11] Patent Number: 5,376,227
[45] Date of Patent: Dec. 27, 1994

[54] MULTILEVEL RESIST PROCESS

[75] Inventor: Jun S. Lee, Seoul, Rep. of Korea

[73] Assignee: Goldstar Electron Co., Ltd., Rep. of Korea

[21] Appl. No.: 145,865

[22] Filed: Nov. 1, 1993

[30] Foreign Application Priority Data

Nov. 12, 1992 [KR] Rep. of Korea ............... 2/233
Nov. 19, 1992 [KR] Rep. of Korea ............... 2/764

[51] Int. Cl.⁵ .................................... B44C 1/22
[52] U.S. Cl. ........................ 156/643; 156/652; 156/655; 156/661.1; 156/904
[58] Field of Search ............ 156/643, 651, 652, 653, 156/654, 655, 656, 657, 659.1, 661.1, 662, 667, 668, 904; 430/312, 313, 317, 318

[56] References Cited

U.S. PATENT DOCUMENTS 3,817,798  6/1974  Jacobus et al. ............ 156/661.1 X
4,362,597 12/1982  Fraser et al. ............. 156/661.1 X
4,454,221  6/1984  Chen et al. ............... 156/904 X

*Primary Examiner*—William Powell
*Attorney, Agent, or Firm*—Poms, Smith, Lande & Rose

[57] ABSTRACT

A method for forming a MLR pattern.

The method comprises the steps of:

forming a bottom resist film on a semiconductor substrate in which a semiconductor device is formed;

forming a inter-layer on the bottom resist film;

forming a top resist film on the inter-layer, wherein a first top resist film made of an inorganic material and a second top resist film made of another inorganic material and formed on the first top resist film;

exposing the top resist film using a pattern mask;

etching the exposed portion of the second top resist film of the top resist film;

etching the first top resist film using the remained-unexposed portion of the second top resist file made of the second inorganic material as an etch mask, to form a pattern of the top resist film;

etching the inter-layer and the bottom resist film using the pattern of the top resist film as an etch mask, in this order, to form a MLR pattern; and removing the pattern of the top resist film.

18 Claims, 8 Drawing Sheets

MULTILEVEL RESIST PROCESS

BACKGROUND OF THE INVENTION

The present invention relates to a multi-level resist process, and more particularly to a method for forming the pattern utilizing an inorganic material.

FIGS. 1a to 1d are to show a conventional process for forming the pattern of multi-level resist, in case that any step is not existed.

Figure 1A:
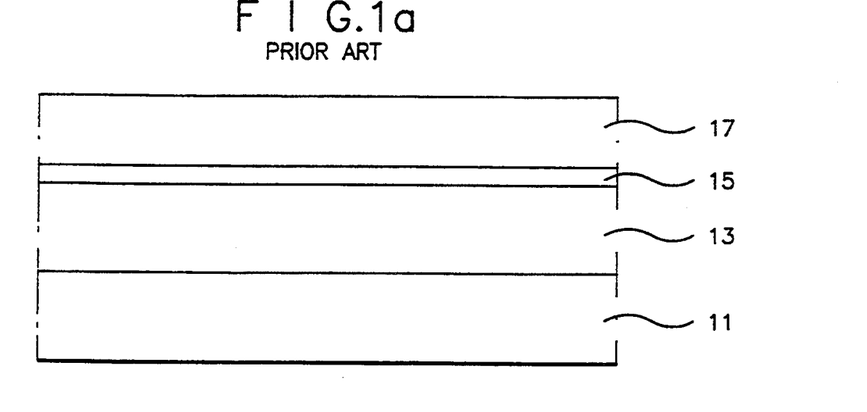
FIGS. 1A to 1D are sectional view showing a conventional process for forming a MLR pattern using an organic resist, in case that steps are existed.

As shown in FIG. 1a, first, a bottom resist film 13, an inter-layer 15 and a positive top resist film 17 are coated on a semiconductor 11, in this order.

The bottom resist film 13 and the top resist film 17 are organic resists and the inter-layer 15 is made of one of spin on glass(SOG) film and PE oxide film, as an insulating film.

Figure 1B:
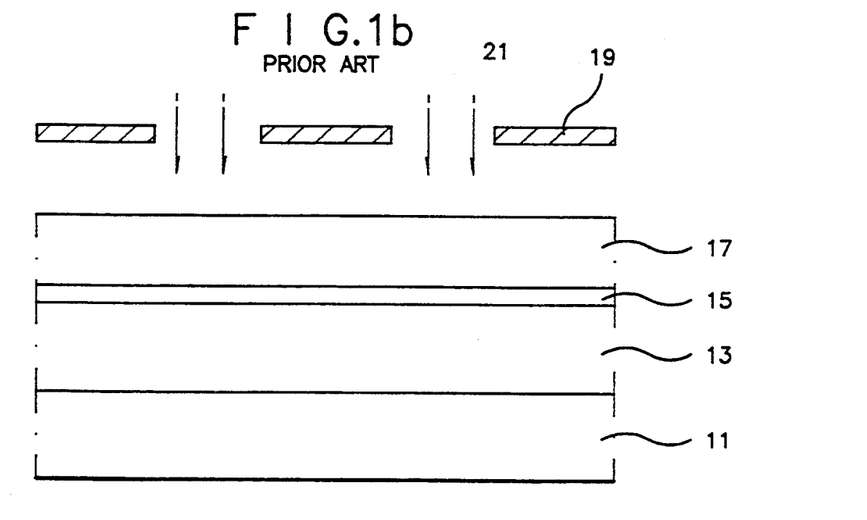

As shown in FIG. 1B, the top resist film 17 is exposed by a light source 21, using a pattern mask 19.

Since the exposed portion of positive top resist film 17 is removed upon performing a development process, the pattern of positive top resist film 17 is formed.

Figure 1C:
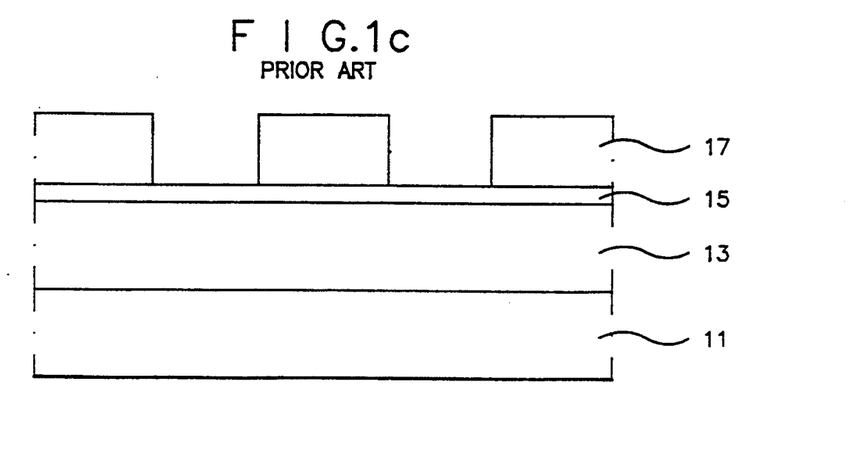

Subsequently, the inter-layer 15 and the bottom resist film 19 are etched to form a multi-level resist(MLR) pattern 23, using the pattern of top resist film 17 as an etch mask.

The MLR pattern 23 will be served as an etch mask, upon etching a polysilicon film, metal film and oxide film which are used as lower layers.

Figure 1D:
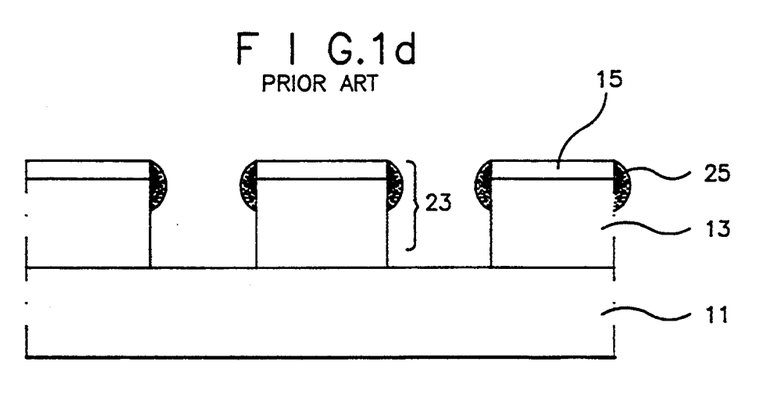

According to Conventional methods for forming a MLR pattern using an organic resist, a polymer 25 is formed at the side walls of MLR pattern 23 by the reaction of Cl⁻ upon etching the top resist film 17 made of organic material.

Therefore, since the MLR pattern 23 has the bias of irregular line width in accordance with the degree in concentration and the micro-loading effect is thus caused, there is a disadvantage in that it is difficult to adjust critical dimension.

FIGS. 2A to 2D are to show a conventional process for forming the MLR pattern utilizing an organic resist, in case that steps exist.

Figure 2A:
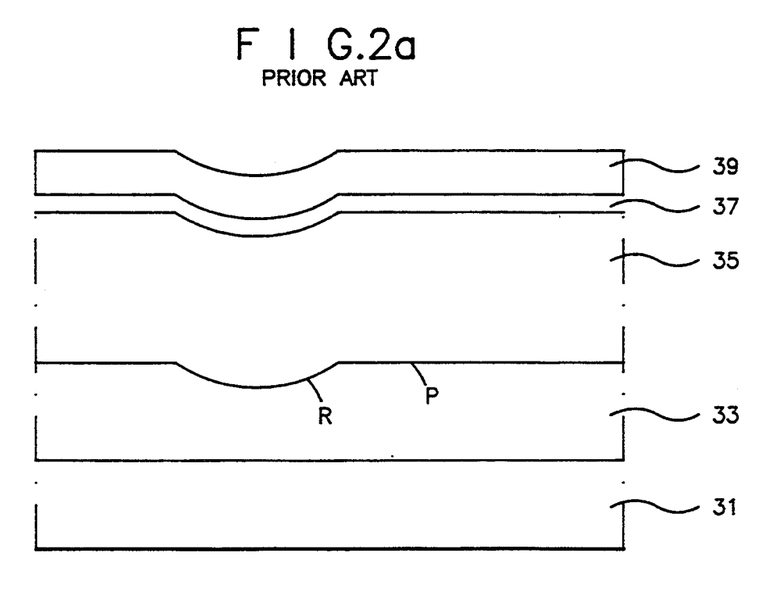
FIG. 2A to 2C are sectional views showing a conventional process for forming a MLR pattern using an organic resist, in case that steps are existed.

Referring to FIG. 2A, there is illustrated a semiconductor device such as a three-dimensional capacitor cell which has a surface comprising flat portions P and recess portions R.

As shown in FIG. 2A, the steps are occurred between the flat portions P and the recess portions R of the surface.

Subsequently, a MLR planarization process is carried out to the above-steps.

That is, a bottom resist film 35 made of an organic material is thickly deposited on the whole surface of substrate.

An insulation film such as SOG film or PE oxide film is formed on the bottom resist film 35 as an inter-layer 37 and a top resist film 39 made of an organic material is then deposited on the inter-layer 37.

At this time, the top resist film 39 has a positive type.

Although the MLR planarization process is carried out, the whole surface is not planarized completely due to the steps at the surface of the semiconductor device.

Figure 2B:
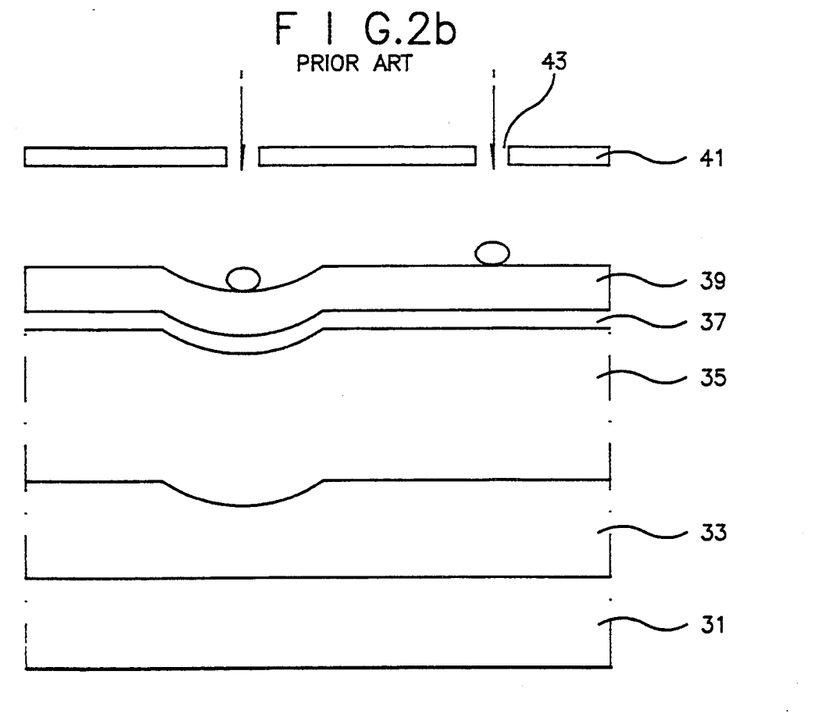

Referring to FIG. 2B, the MLR planarization process is performed and a contact hole is then defined, using a pattern mask 41.

Upon performing an exposure by a light source 43 to define the contact hole, the surface area of the top resist film 39 being exposed by the light source 43 becomes different at the flat portions P and the recess portions R which are occurred due to the steps of surface.

Figure 2C:
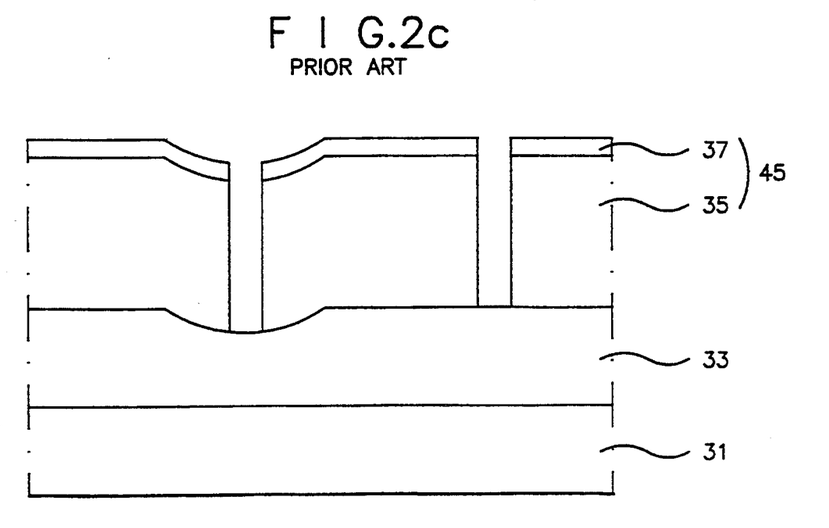

Referring to FIG. 2C, a process same as the MLR pattern of FIG. 1 is carried out to form a MLR pattern 45.

Figure 2D:
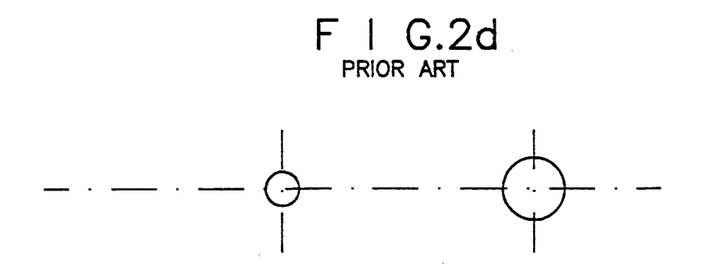
FIGS. 2D to 2E are sectional views showing a conventional process for forming a contact hole using the MLR pattern of FIG. 2C.

In case that steps are existed, however, since the surface area of the top resist film 39 being exposed at the flat portions P and the recess portions R becomes different as shown in FIG. 2D, it is difficult to exactly obtain the MLR pattern having a desired width.

Figure 2E:
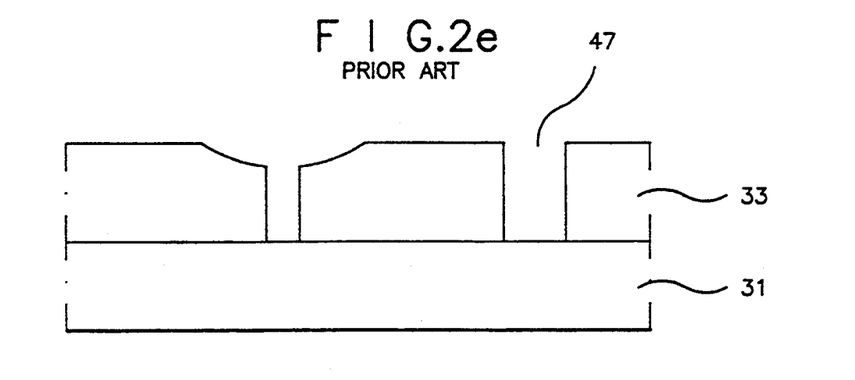

As shown in FIG. 2E, it is therefore impossible to obtain a contact hole 47 having a desired size although a contact hole 47 is formed by etching the semiconductor device which is the bottom layer of MLR pattern 45, using the MLR pattern 45.

That is, FIG. 2 is to show a plan view to the contact hole 47, the size of contact hole at the recess portions R is different from that of the flat portions P.

Therefore, according to the conventional method for forming a MLR pattern using an organic resist, there is an disadvantage in that the surface is not planarized even after the planarization process is completed, in case that the steps of semiconductor device is above about 1.5 $\mu$m.

As shown in FIG. 2B, since the steps of semiconductor device which are the bottom layer are maintained to the top layer, it is impossible to form the desired pattern exactly.

Since the organic resist film is also used identically, even in case that the steps are existed, the polymer is formed at the side planes of MLR pattern as shown in FIG. 1, thereby causing the shape of contact hole itself to be deformed.

SUMMARY OF THE INVENTION

Therefore, an object of the present invention is to provide a method of forming a MLR pattern using a non-organic resist capable of obtaining an exact pattern.

In accordance with the present invention, this object can be accomplished by providing a method of forming a MLR pattern comprising the steps of:

depositing a bottom resist film on a semiconductor substrate in which a semiconductor device having steps is formed;

forming a inter-layer on the bottom resist;

depositing a top resist on the inter-layer, wherein the top resist comprising a first inorganic resist film and a second inorganic resist film;

exposing the top resist film using a pattern as an exposure mask;

etching the exposed portion of the second inorganic resist film of the top resist film;

etching the first inorganic resist film using the remained portion of the second inorganic resist film as a etch mask, to form a pattern of the top resist film;

etching the inter-layer and the bottom resist film using the pattern of top resist film as a etch mask, in this order, to form a MLR pattern; and removing the remained pattern of top resist film.

DETAILED DESCRIPTION OF THE PREFERRED EMBODIMENT

Referring to FIG. 2 there is illustrated a process forming a MLR pattern using an inorganic resist in accordance with an embodiment of the present invention.

Figure 3A:
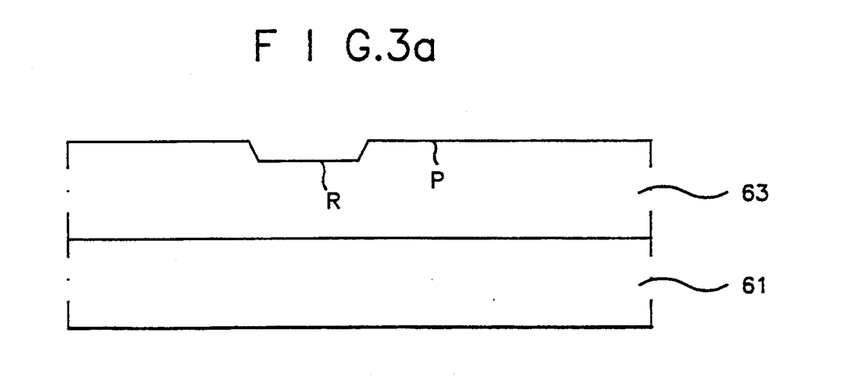
FIGS. 3A to 3F are sectional views showing a process for forming a MLR pattern using an inorganic resist, in accordance with the present invention.

As shown in FIG. 3A, first, a semiconductor device 63 is formed on a semiconductor substrate 61. Herein, it is assumed that the semiconductor substrate 61 has steps same as those of a three-dimensional capacitor cell.

The surface of semiconductor device 63 includes recess portions R and flat portions P.

Figure 3B:
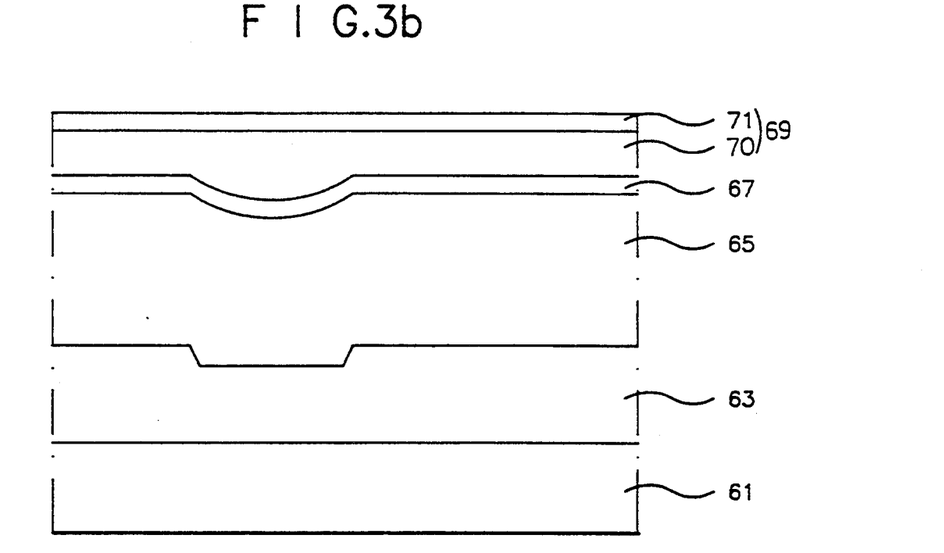

As shown in FIG. 3B, a bottom resist film 65 is formed on the semiconductor substrate 61 in which the semiconductor device 63 is formed with a thickness more thick above 30% than the steps of the semiconductor device 63, to planarize the surface firstly.

An inorganic resist film such as $Ge_x Se_{1-x}$ or an organic resist film may be used as a material of the bottom resist film 65.

An insulation film such as PE oxide film or spin on glass(SOG) in formed as an inter-layer 67, on the bottom resist film 65. a positive top resist film 69 is then formed to planarize the surface secondly.

Therefore, the surface is completely planarized.

The top resist film 69 has a structure of two stories and is comprised of a first top resist film 70 made of an inorganic material such as $Ge_x Se_{1-x}$ and a second top resist film 71 made of a inorganic material such as $Ag_2S/As_2S_3$ or $As_2Se_3$ $Ag_2Te/As$-$Te$ etc. besides of inorganic resist films such as $Ag_2Se/Ge_xSe_{1-x}$.

The first top resist film 70 made of an inorganic material is deposited with a thickness of 2000–3000 Å by a radio frequency (RF) sputtering method and second the top resist film 71 made of an inorganic material is deposited with a thickness smaller than 500 Å.

Figure 3C:
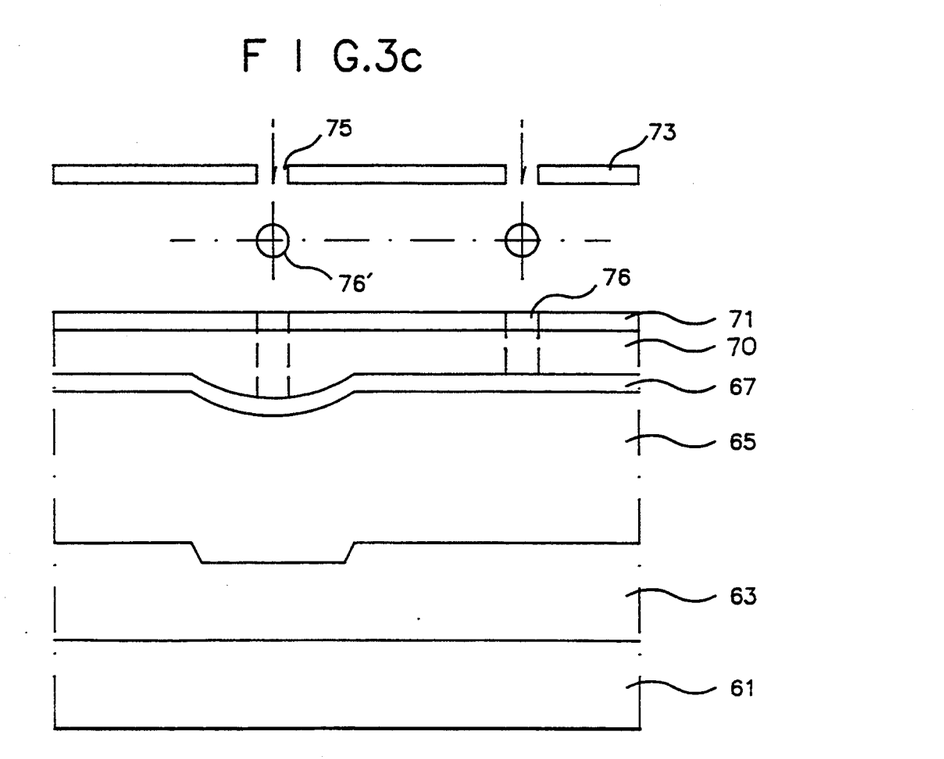

As shown in FIG. 3C, if an exposure process is performed by a light source 75 using a pattern mask after the above planarization processes are performed, the photo doping phenomenon is occurred at the portion exposed by the light source 75, of the top resist film 69.

Figure 3D:
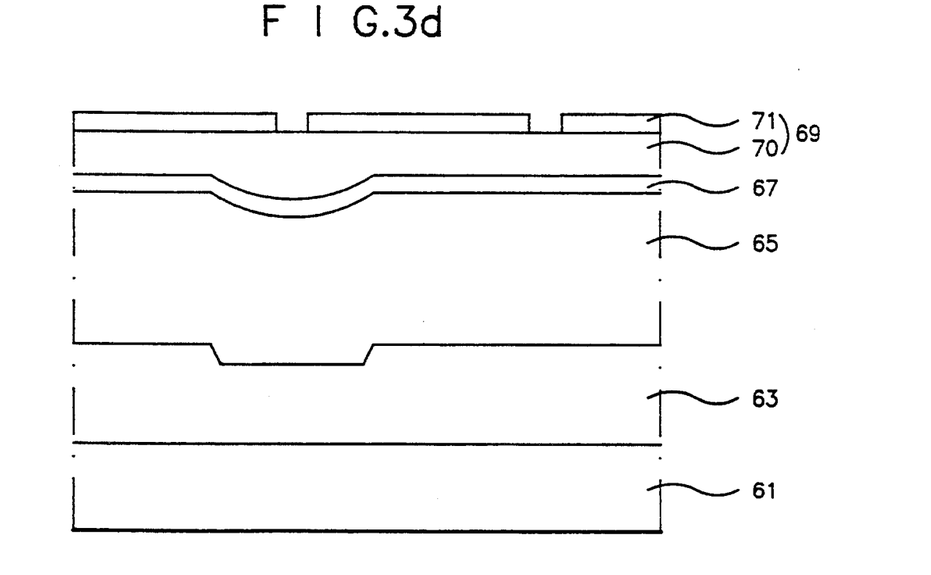
Figure 3E:
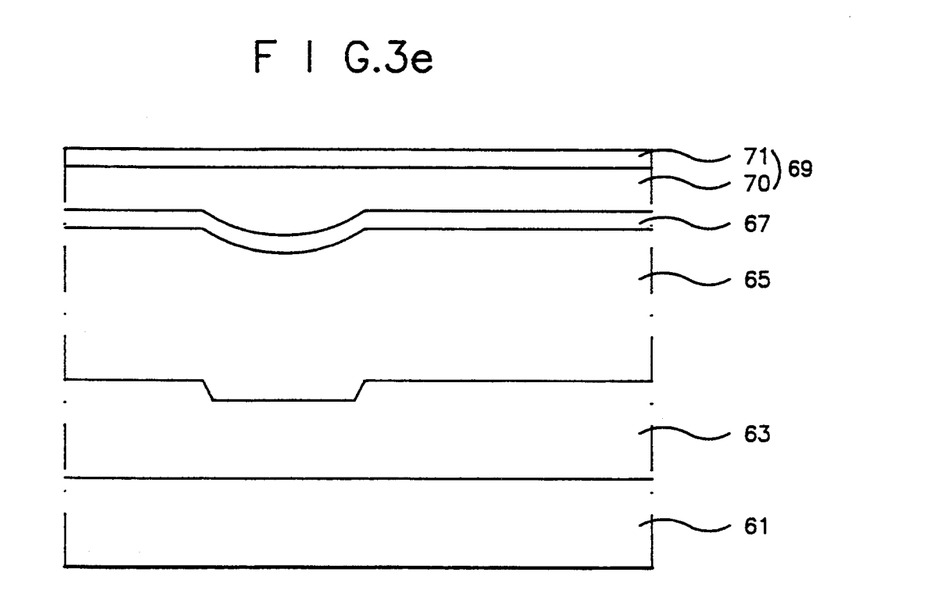

Thereafter, the exposed 76 of the second top resist film 71 made of an inorganic material is etched by an alkaline solution as shown in FIG. 3D and the exposed portion of the first top resist film 70 made of an inorganic material is etched using the remained-unexposed portion of the second top resist film made of an inorganic material as an etch mask, thereby enabling a pattern 69 of top resist film such as FIG. 3E to be obtained.

In FIG. 3C, a reference number 76 denotes the exposed portion 76 of the top resist film 69 which is drawn in a plan view.

Since the surface of the top resist film 69 has been completely planarized, the exposed portion 76 has a same dimension as that of the pattern mask 73 upon exposing the top resist film 69 under the light source 75.

Figure 3F:
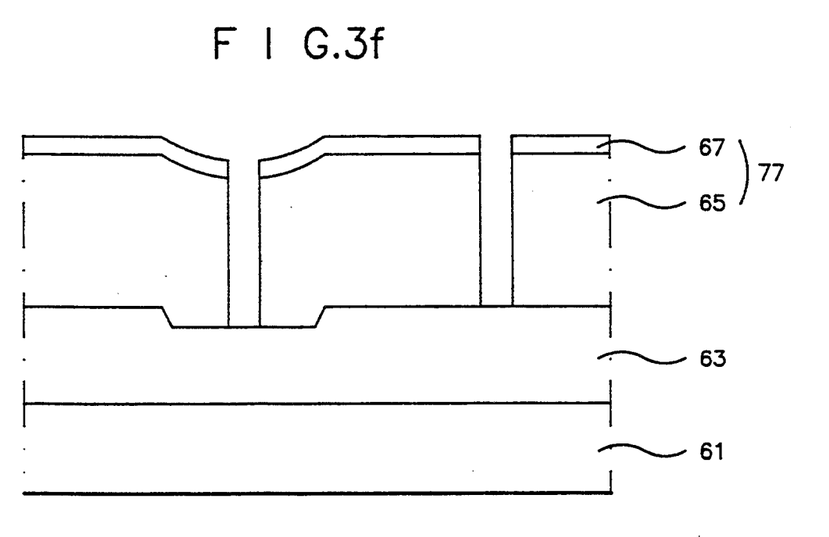

As shown in FIG. 3F, the inter-layer 67 and the bottom resist film 65 are etched using the pattern of the top resist film 69 as an etch mask to obtain a MLR pattern 77.

Subsequently, the unexposed portion of the top resist film 69 is all removed.

Of the top resist film 69, the unexposed portion of the second top resist film 71 made of an inorganic material is removed by a compound solution of $HNO_3$—$HCl$—$H_2O$ and the unexposed portion of the first top resist film 70 made of an inorganic material is removed by a gas such as $CF_4$, $CHF_3$ and $SF_6$ or an alkaline solution.

In case of forming a MLR pattern using a negative type of top resist film, on the other hand, the unexposed portion of the second top resist film 71 made of an inorganic material is etch by a compound solution of $HNO_3$—$Hcl$—$H_2O$ and the unexposed portion of the first top resist film 70 made of an inorganic material is etched using the un exposed portion of the second top resist film 71 made of the second inorganic material as an etch mask, thereby causing a pattern of the top resist film 69 to be formed.

The inter-layer 67 and the bottom resist film 65 are etched using the pattern of the top resist film 69 as an etch mask, to form a MLR pattern 77.

The portion of the top resist film 69 which is remained after the formation of MLR pattern 77, that is, the exposed portion 76 of the second top resist film 71 made of an inorganic material is removed using an alkaline solution or a gas such as $CF_4$, $CHF_3$ and $SF_6$.

Figure 3G:
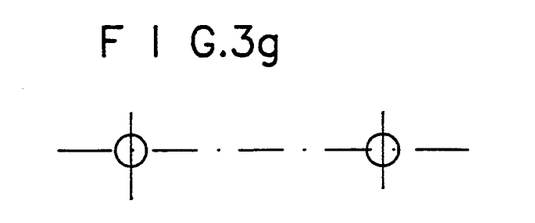
FIGS. 3G and 3H are sectional views showing a process for forming a contact hole using the MLR pattern of FIG. 3F.
Figure 3H:
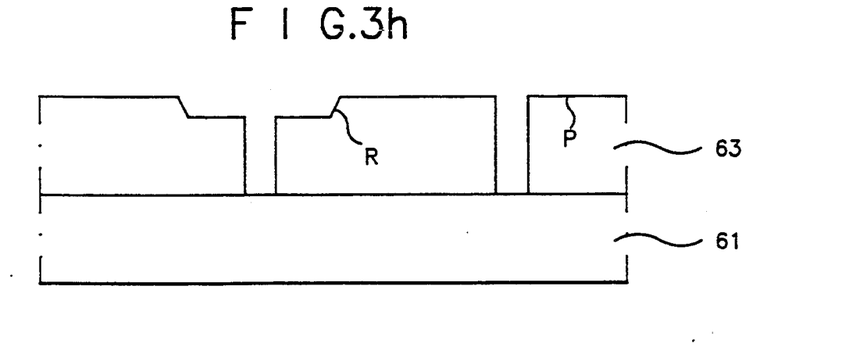

FIG. 3H is a sectional view showing a process for forming a contact hole 79 using the MLR mask 77 obtained from the above-process.

That is, the semiconductor device 63 serving as the lower layer is etched using the MLR mask 77, to form the contact hole 79.

FIG. 3G is to show the contact hole in a plan view.

According to FIG. 3G, it can be seen to obtain the contact hole 79 having a size that the recess portions R and the flat portions P of the semiconductor device 63 do all require.

Figure 4A:
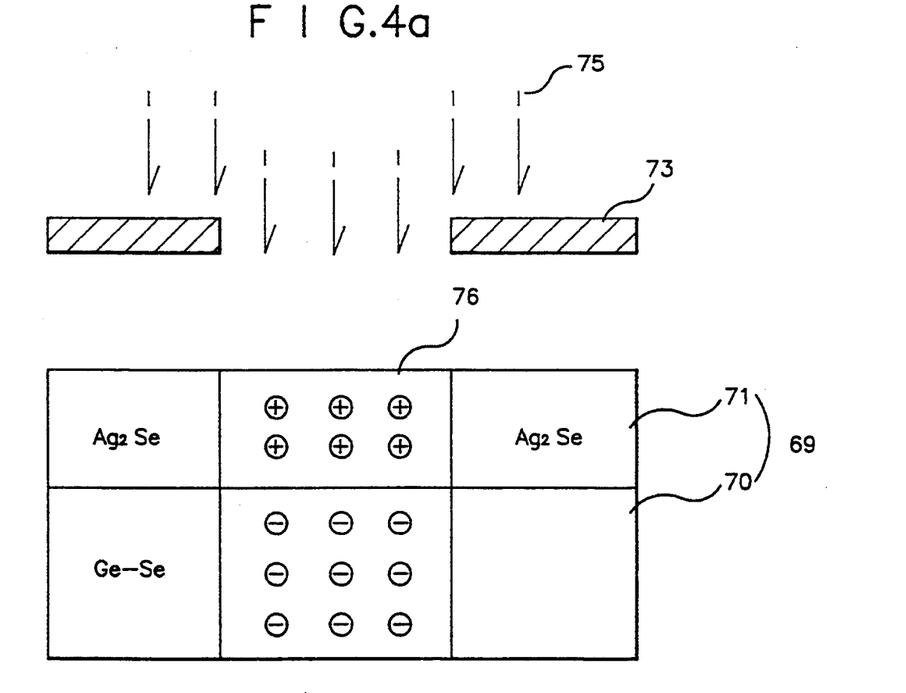
FIG. 4A and 4B are diagram for explaining the principle of exposure upon forming the MLR pattern of FIG. 3.
Figure 4B:
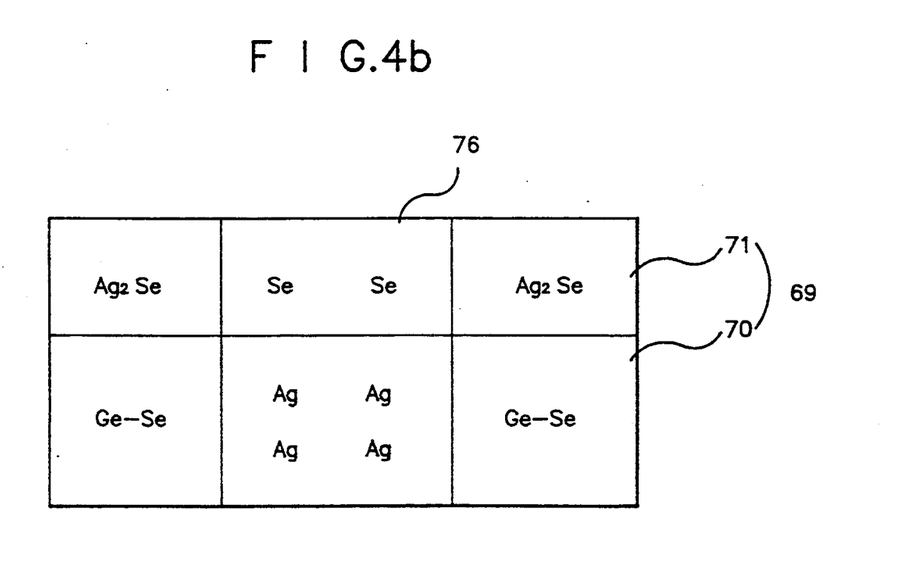

FIG. 4 is a drawing for explaining the photo-doping phenomenon appearing at the top resist film 69 upon performing the exposure process.

As shown in FIG. 4A, if the top resist film 69 is exposed using the pattern mask 73 as an exposure mask under the light source 75, the photo-doping phenomon is occurred at the portion 76 exposed by the light source 75, of the top resist film 69.

Of the top resist 69, therefore, Ag is migrated from the second top resist 71 made of an inorganic material (for example $Ag_2 Se$) to the first top resist film 70 made of an inorganic material (for example, $Ge_x Se_{1-x}$), thereby causing $Ag^+$ ions to be trapped into the electrons of $Ge_x Se_{1-x}$.

That is, the following reactions are occurred at the top resist film 69 that receives the lights from the light source 75.

According to the present invention, as above mentioned, the following effects can be obtained.

Since the conventional method using an organic resist film can not planarize the surface completely in case that steps are generated above 1.5 m, it is impossible to obtain a MLR pattern exactly.

However, since the present invention can planarize the surface completely using an inorganic resist film, it is possible to obtain an exact MLR pattern.

Therefore, it is possible to obtain a contact hole having a desired size even upon forming the contact hole using the MLR pattern.

Since it is also possible to slove the problem in which a polymer is formed upon etching a MLR made of an organic material, the bias in boundary plane is stabilized and the micro-loading effect is reduced, thereby moreover enabling the resolution to be improved.

What is claimed is:

1. A method for forming a MLR pattern comprising the steps of:
   forming a bottom resist film on a semiconductor substrate in which a semiconductor device having steps is formed;
   forming an inter-layer on the bottom resist film;
   forming a top resist film on the inter-layer, wherein the top resist film comprising a first top resist film made of an inorganic material and a second top resist film made of a another inorganic material and formed on the first resist film;
   exposing the top resist film using a pattern mask;
   etching the exposed portion of the second top resist film of the top resist film;
   etching the first top resist film using the remaining-unexposed portion of the second top resist-film as an etch mask, to form a pattern of the top resist film;
   etching the inter-layer and the bottom resist film using the pattern of the top resist film as an etch mask, in this order, to form a MLR pattern; and
   removing the pattern of top resist film.

2. A method for forming a MLR pattern in accordance with claim 1, wherein the bottom resist film is formed with a thickness larger above 30% than that of the steps of the semiconductor device.

3. A method for forming a MLR pattern is accordance with claim 2, wherein the bottom resist film is made of an organic resist film.

4. A method for forming a MLR pattern in accordance with claim 2, wherein the bottom resist film is made of an inorganic resist film.

5. A method for forming a MLR pattern in accordance with claim 4, the bottom resist film is made of $Ge_x Se_{1-x}$.

6. A method for forming a MLR pattern in accordance with claim 1, the top resist film is made of $Ag_2Se/Ge_x Se_{1-x}$.

7. A method for forming a MLR pattern in accordance with claim 1, the top resist film is made of one of $Ag_2s/As_2S_3$ and $As_2 Se_3$ $Ag_2Te/As-Te$.

8. A method for forming a MLR pattern in accordance with claim 1, wherein the first top resist film is formed with a thickness of 2000 Å–3000 Å by a RF sputtering method.

9. A method for forming a MLR pattern in accordance with claim 1, wherein the second top resist film is formed with a thickness smaller than 500 Å by a RF sputtering method.

10. A method for forming a MLR pattern in accordance with claim 1, wherein the top resist film is a positive type.

11. A method for forming a MLR pattern in accordance with claim 1, wherein the exposed portion of the second top resist film is etched by an alkaline solution.

12. A method for forming a MLR pattern in accordance with claim 1, wherein the second top resist film of the pattern of the top resist film is removed by a compound solution of $HNO_3$-$HCl$-$H_2O$.

13. A method for forming a MLR pattern in accordance with claim 1, wherein the first top resist film of the pattern of the top resist film is removed by an alkaline solution.

14. A method for forming a MLR pattern in accordance with claim 1, wherein the first top resist film of the pattern of the top resist film is removed by using one of $CF_4$ gas, $CHF_3$ gas and $SF_6$ gas.

15. A method for forming a MLR pattern comprising the steps of:
   forming a bottom resist film on a semiconductor substrate in which a semiconductor device having steps is formed;
   forming an inter-layer on the bottom resist film;
   forming a top resist film on the inter-layer, wherein the top resist film comprises a first top resist film made of an inorganic material and a second top resist film made of another inorganic material and formed on the first top resist film;
   exposing the top resist film using a pattern mask;
   etching the unexposed portion of the second top resist film of the top resist film;
   etching the first top resist film using the remaining-exposed portion of the second top resist film as an etch mask, to form a pattern of the top resist film;
   etching the inter-layer and the bottom resist film using the pattern of the top resist film as an etch mask, in this order, to form a MLR pattern; and
   removing the pattern of top resist film.

16. A method for forming a MLR pattern in accordance with claim 15, wherein the top resist film is a negative type.

17. A method for forming a MLR pattern in accordance with claim 15, wherein the unexposed portion of the second top resist film is etched by a compound solution of $HNO_3$-$HCl$-$H_2O$.

18. A method for forming a MLR pattern in accordance with claim 15, wherein the pattern of the top resist film is removed by an alkaline solution.

* * * * *